(12) United States Patent
Bahl et al.

(10) Patent No.: US 11,638,354 B2
(45) Date of Patent: Apr. 25, 2023

(54) PROCESS FOR FABRICATION OF A PRINTED CIRCUIT BOARD USING A SEMI-ADDITIVE PROCESS AND REMOVABLE BACKING FOIL

(71) Applicant: CATLAM LLC, Sunnyvale, CA (US)

(72) Inventors: Kenneth S. Bahl, Saratoga, CA (US); Konstantine Karavakis, Pleasanton, CA (US)

(73) Assignee: CATLAM, LLC, Sunnyvale, CA (US)

( * ) Notice: Subject to any disclaimer, the term of this patent is extended or adjusted under 35 U.S.C. 154(b) by 178 days.

(21) Appl. No.: 16/937,579

(22) Filed: Jul. 24, 2020

(65) Prior Publication Data
US 2020/0389983 A1 Dec. 10, 2020

Related U.S. Application Data

(63) Continuation of application No. 15/645,921, filed on Jul. 10, 2017, now Pat. No. 10,765,012.

(51) Int. Cl.
*H05K 3/42* (2006.01)
*H05K 3/00* (2006.01)
*H05K 3/06* (2006.01)
*H05K 3/46* (2006.01)

(52) U.S. Cl.
CPC ............ *H05K 3/429* (2013.01); *H05K 3/007* (2013.01); *H05K 3/0035* (2013.01); *H05K 3/0038* (2013.01); *H05K 3/06* (2013.01); *H05K 3/064* (2013.01); *H05K 3/421* (2013.01); *H05K 3/422* (2013.01); *H05K 3/423* (2013.01); *H05K 3/4652* (2013.01); *H05K 3/425* (2013.01); *H05K 2203/0152* (2013.01); *H05K 2203/0723* (2013.01); *H05K 2203/107* (2013.01); *H05K 2203/1407* (2013.01)

(58) Field of Classification Search
CPC ... H05K 2203/0152; H05K 2203/0723; H05K 2203/107; H05K 2203/1407; H05K 3/0035; H05K 3/0038; H05K 3/007; H05K 3/06
See application file for complete search history.

(56) References Cited

U.S. PATENT DOCUMENTS

| | | | |
|---|---|---|---|
| 6,344,371 B2 | 2/2002 | Fischer et al. | |
| 9,398,703 B2 | 7/2016 | Karavakis et al. | |
| 10,765,012 B2* | 9/2020 | Bahl | H05K 3/06 |
| 10,863,629 B2* | 12/2020 | Hatanaka | H05K 3/42 |
| 2015/0334825 A1 | 11/2015 | Bahl et al. | |
| 2016/0278206 A1 | 9/2016 | Bahl et al. | |
| 2020/0389983 A1* | 12/2020 | Bahl | H05K 3/0035 |

* cited by examiner

*Primary Examiner* — Minh N Trinh
(74) *Attorney, Agent, or Firm* — File-EE-Patents.com; Jay A. Chesavage

(57) ABSTRACT

A method for forming a circuit board having a dielectric core, a foil top surface, and a thin foil bottom surface with a removable foil backing of sufficient thickness to absorb heat from a laser drilling operation to prevent the penetration of the thin foil bottom surface during laser drilling utilizes a sequence of steps including a laser drilling step, removing the foil backing step, electroless plating step, patterned resist step, electroplating step, resist strip step, tin plate step, and copper etch step, which provide dot vias of fine linewidth and resolution.

16 Claims, 8 Drawing Sheets

Standard Linewidth Process

Dielectric w/foil

Laser Drill Blind Vias

After electroless plate

After resist

After electroplate

1st Smoothing

Strip Resist

Standard Linewidth Process

2nd Planarizing

Drill Thru Holes

After Electroless Cu

Patterned Resist

Electro Plate Cu
Electro Plate Sn

After Resist Strip

Etch Cu
Etch Sn dielectric w/thin top foil
& thin bot foil w/Cu bkg

Laser Drill Blind Vias &
drill thru holes

Remove backing foil

After Electroless Cu

After resist

Fine Linewidth Process

Electro Plate Cu
(Fill Via, trace, hole)

Sn Plate

Strip Resist

Quick Etch Cu
Quick Etch Sn

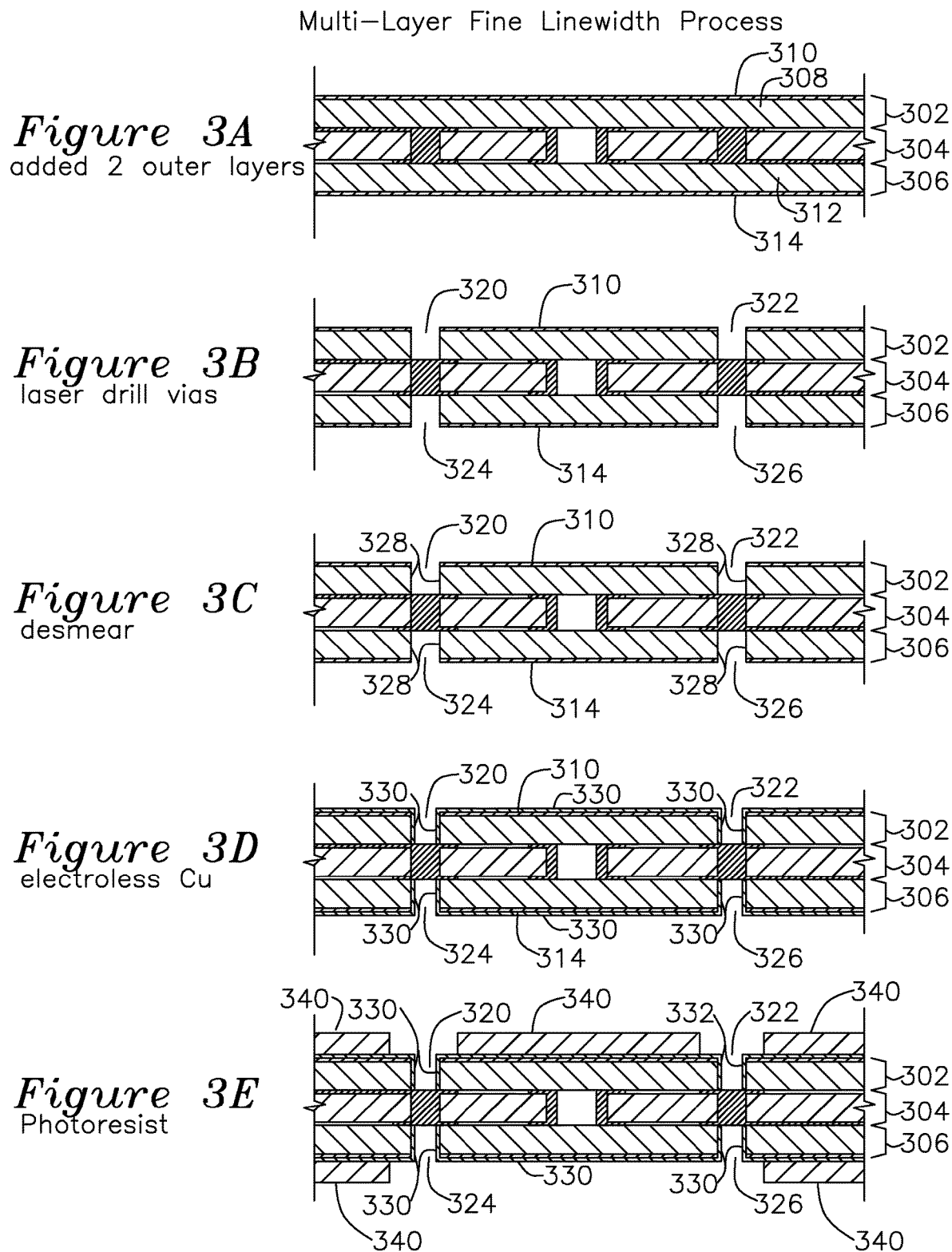

Multi-Layer Fine Linewidth Process

ElectroPlate Tin Plate

Strip Resist

Quick Etch

Fine Linewidth Process

Catalytic Dielectric w/bottom thin foil and thick backing foil

Laser Drill Blind Vias, drill thru holes, form top channels

Remove backing foil

After fast electroless Cu

After resist (bot side only)

After quick Cu-etch

After resist strip

Multi-Layer Fine Linewidth Process added 2 outer layers

Laser drill vias, form trace channels electroless Cu

PROCESS FOR FABRICATION OF A PRINTED CIRCUIT BOARD USING A SEMI-ADDITIVE PROCESS AND REMOVABLE BACKING FOIL

This patent application is a continuation of U.S. patent application Ser. No. 15/645,921 filed Jul. 10, 2017, now issued as U.S. Pat. No. 10,765,012.

FIELD OF THE INVENTION

The present invention relates to a circuit board and an associated method for fabrication. In particular, the invention is related to a circuit board and method for forming fine pitch vias and associated fine pitch traces.

BACKGROUND OF THE INVENTION

Prior art printed circuit boards (PCBs) are formed using conductive metal interconnects (known as "traces") formed on a dielectric substrate. Conductive apertures are formed on the circuit board to bridge traces on opposite sides of the dielectric substrate, where the conductive apertures which have a larger diameter and may be used for mounting components are known as "through holes" and a minimal diameter conductive aperture which is used to interconnect traces on opposite sides is known as a "dot via" (prior to the formation of traces) or simply "via" (after the traces are formed). Each surface carrying trace conductors is known as a "layer", and each dielectric substrate having traces formed on one surface or on both surfaces form a "sub", which is a fundamental subassembly of a multi-layer board. By stacking several such subs, each sub comprising a dielectric core having traces and interconnecting vias interspersed with bare dielectric layers, and laminating them together under temperature and pressure, a multi-layer printed circuit may be formed. The dielectric substrate may comprise an epoxy resin embedded in a fiber matrix such as glass fiber woven into a cloth.

One difficulty of prior art circuit board fabrication is the formation of deep (high aspect ratio) vias and fine pitch vias. Because electroplating operations consume the metal ions in solution, it is difficult to form vias with high aspect ratios, as the more distant regions of the via from the metal ion bath have lower concentrations of metal ions for deposition than regions of the via which are near to, and replenished by, the circulating ion bath. Small diameter vias are similarly diameter-limited by the aspect ratio of the via, which is governed by the thickness of the circuit layer to be formed. Blind vias (which are open on one end only) limit the circulation of metal ions in solution at the closed end of the via.

Another difficulty of fine pitch circuit board fabrication is that dot via structures are formed in a first step, through holes are formed in a separate step, and traces are formed in a subsequent step. It is desired to form dot vias, through hole plating, and traces in a single electroplating step. It is also desired to form vias having the aspect ratio for a single layer but which are continuous through multiple layers, thereby forming stacked vias. It is also desired to provide a method which provides for reduced diameter vias and fine pitch traces for use in fabricating fine pitch PCBs.

OBJECTS OF THE INVENTION

A first object of the invention is a process for forming a circuit layer having dot vias, stacked vias, through holes, and traces, the process utilizing a dielectric having a thin conductive foil layer applied to a bottom surface and a comparatively thick backing foil layer applied to the thin conductive foil, the circuit layer optionally also having a top surface conductive foil applied opposite the bottom surface, the circuit layer subsequently having a blind via drill step whereby a laser ablates the dielectric to the level of the bottom thin foil layer, the backing layer removing heat from the bottom foil to prevent penetration or melting of the thin foil during laser ablation of the dielectric, and an optional through hole step for drilling holes through all layers of the board and foil layers, a thick backing foil removal step, electroless deposition of copper on thin foil and exposed dielectric surfaces in an electroless deposition step, a pattern resist step applied to at least one surface of the circuit layer, an electro plating step depositing copper on unmasked copper areas, a secondary plate mask step depositing a mask material such as tin on exposed copper areas, a resist strip step, and a quick etch step to remove the electroless deposition material such as copper which is not coated with the secondary plate material such as tin, and a quick etch step to remove the secondary plate mask material such as tin.

A second object of the invention is a circuit board having been made by applying a thin foil to a bottom surface of a dielectric, applying a thick backing foil to the bottom surface tin foil, optionally applying a foil to the top surface of the dielectric opposite the bottom surface, laser drilling or ablating material from the top surface through the dielectric and down to the bottom thin foil without penetration of the bottom thin foil, the penetration of the bottom thin foil prevented by thickness selection of the backing foil as a heat sink, thereafter removing the backing foil, thereafter electroless plating the circuit board, thereafter applying patterned resist to at least one surface, thereafter electroplating the circuit board, the electroplating operative on exposed copper of the circuit board, thereafter plating the exposed copper with a mask material such as tin, thereafter performing a quick etch of exposed copper to remove copper which has not been plated with the mask material such as tin, thereafter optionally performing a quick etch to remove any exposed tin.

A third object of the invention is a multilayer circuit board formed by:

forming an inner layer from a dielectric having a thin conductive layer on a top and bottom surface, the conductive layers having a comparatively thick foil applied to each surface, the comparatively thick foil removed from a top surface, holes drilled through the top foil and dielectric such as by laser to form via apertures, the laser drilled via apertures prevented from penetrating the top foil by the heat sinking capability of the bottom surface comparatively thick foil, removing the bottom surface comparatively thick foil, electro-less plating the exposed dielectric surfaces and foil surfaces, applying a resist pattern to the top surface and the bottom surface, electro-plating the exposed copper surfaces not covered by resist until at least one via aperture is plugged, tin plating the exposed copper surfaces not covered by resist, stripping the photoresist, quick etching the exposed copper surfaces sufficiently to remove copper previously covered by photoresist, and optionally etching the tin plating;

adding one or more pairs of outer layers to the inner layer, each outer layer formed by laminating the non-foil side of a dielectric having one surface covered with foil to the inner layer, thereafter drilling at least one via aperture on at least one outer layer which is substantially over an inner layer filled via, thereafter electroless plating the via apertures and exposed foil surfaces, thereafter applying a pattern mask, thereafter electro-plating the via apertures and exposed foil surfaces, thereafter tin plating the exposed copper surfaces, thereafter stripping the pattern mask, thereafter quick etching the foil and electroless plating which was under the pattern mask until the foil and electroless plating is removed, thereafter optionally stripping the tin, thereby forming a new inner layer for subsequent outer layers to be applied.

SUMMARY OF THE INVENTION

In a first embodiment of the invention, at least one via is formed on a circuit board, the circuit board having a bottom surface covered with a bottom thin copper foil and a comparatively thick layer of removable copper backing foil placed over the bottom thin copper foil, the circuit board optionally having a top surface thin copper foil applied to a top surface opposite the bottom surface, the circuit board thereafter having laser drilled blind holes formed from the top surface to the bottom thin copper foil, but not penetrating through the thin copper foil, the copper backing foil having a sufficient thickness to prevent the heat developed by the laser from ablating the first thin copper foil by coupling thermal energy to the backing foil and surrounding region of backing foil. The backing foil is then removed upon completion of drilling the holes or via apertures. The ablated via apertures and any through holes have catalytic inner surfaces, such as either by use of a catalytic dielectric laminate, or by application of catalyst to the exposed via aperture surfaces during a desmearing operation. The circuit board is thereafter exposed to an electroless plating bath of metal ions such as copper, which bind to the catalytic particles present in the via aperture and spread until a continuous deposition is made in the via aperture surfaces and through hole aperture surfaces, as well as in the copper foil areas, creating a uniformly conductive surface for subsequent electro-plating. Patterned resist is next applied, which prevents depositions from a subsequent electro-plating operation from forming in areas covered by resist. Using the continuous conductive surface and exposed regions without resist, the circuit board is used as an electrode in an electro-plating step performed until the electroless copper deposition reaches the depth of the photoresist, or a desired depth typically less than the photoresist thickness. A tin plate step subsequently deposits tin over the exposed copper surfaces, which serves as an etching mask for a subsequent copper etch operation, after which the photoresist is stripped, leaving tin-masked copper and exposed copper. A quick etch of exposed copper removes the exposed copper comprising thin bottom copper foil and the optional top copper foil which was in patterned photoresist areas. After removal of the exposed copper in the quick etch step, which leaves the tin-masked copper unaltered, the tin is optionally etched. The resultant vias are conductively plugged and mechanically smaller than vias produced by prior art processes.

BRIEF DESCRIPTION OF THE DRAWINGS

FIGS. 3A, 3B, 3C, 3D, 3E, 3F, 3G, and 3H show cross section views of processing steps for a multi-layer fine linewidth process.

DETAILED DESCRIPTION OF THE INVENTION

Figure 1A:
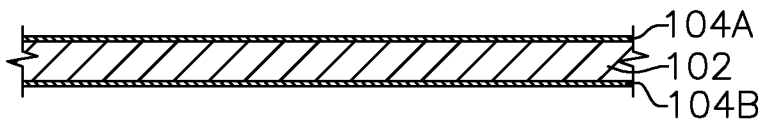
FIGS. 1A, 1B, 1C, 1D, 1E, 1F, 1G, 1H, 1I, 1J, 1K, 1L, 1M, and 1N show cross section views of processing steps for a standard linewidth process for forming traces and dot vias for an inner layer of a multi-layer board or a two layer circuit board.

FIG. 1A shows cross section of a dielectric 102 having an optional top surface foil 104A and bottom surface foil 104B, which are approximately 0.3 mil (7.5 u) thick. Dielectric 102 comprises a mixture of reinforcing fibers and epoxy resin. Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon) blend resin, or other resins. Deposition of conductors such as copper may be performed using two different plating techniques. In a first electroless plating technique, the dielectric layer is formed by mixing the resin with catalytic particles which attract copper ions. The rate of electroless metallic copper deposition is slower than electroplating, but the deposition occurs on all surfaces which have exposed catalytic particles, as well as on surfaces which have exposed copper. Electro-plating provides a faster rate of copper deposition because it utilizes a sacrificial copper anode having a positive voltage is placed into an electrolyte bath, with the surface to be plated connected to a negative voltage. The copper migrates as metal ions from the anode through the electrolyte to the cathodic surface. In the present example, the cathodic surface is the PCB needing copper plating. Electroplating requires that all surfaces have a common potential, which is typically accomplished using a pre-existent copper foil or a preceding electroless plating step on a dielectric surface having exposed catalytic particles until continuous electrical conductivity across the entire board allows for the board to be used as a cathode, as required for an anodic copper source. Electroless plating may be in the range 0.06 mil (1.5 u) to 0.12 mil (3 u) to provide sufficient surface conductivity for electroplating.

While the description is drawn to the formation of copper vias and traces using catalysts for electroless copper formation, it is understood that the scope of the invention may be extended to other metals suitable for electroless plating and electro-plating. For electroless deposition of copper (Cu), elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, it is known in the art that other catalysts for attracting copper ions may also be used. In one example of the invention suitable for use in a catalytic laminate, the catalytic particles are homogeneous catalytic particles. In another example of the invention forming a catalytic laminate, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide ($SiO_2$), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: BrPd, $CL_2Pd$, $Pd(CN)_2$, $I_2Pd$, $Pd(NO_3)_2*2H_2O$, $Pd(NO_3)_2$, $PdSO_4$, $Pd(NH_3)$ $4Br_2$, $Pd(NH_3)4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers).

Among the catalysts, palladium is a preferred catalyst because of comparative economy, availability, and mechanical properties, but other catalysts may be used.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant ε (permittivity), which is often approximately 4 and governs the characteristic impedance of a transmission line formed on the dielectric, and loss tangent δ, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller than 25 u. These are example catalytic particle size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings such that all catalytic particles smaller than 25 u are selected, and the grinding operation determines the aspect ratio of the particles in the smallest dimension direction. Aspect ratios less than 2:1 are preferable, but not limited to that range for the present example embodiment, and the catalytic particles may be heterogeneous or homogeneous catalytic particles. In another example, the catalytic resin mixture 106 is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 8-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

Figure 1B:
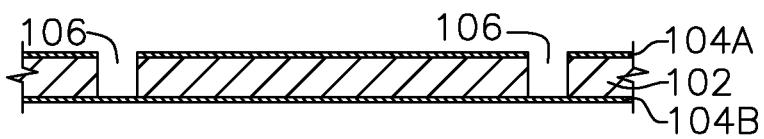

FIG. 1A dielectric 102 is faced with top foil 104A and bottom foil 104B. FIG. 1B shows a laser drilling process, whereby apertures 106 are formed by application of high power optical energy, such as from a laser which elevates the temperature of the foil 104A and dielectric 102 sufficiently to ablate (vaporize) the copper 102 and dielectric 104 until the bottom surface 104B is reached. A typical aspect ratio (depth of via divided by diameter) for laser drilling which provides for successful subsequent electroplating is in the approximate range 0.5 to 1.0. The objective of laser drilling 106 in FIG. 1B is to provide small dimension vias for subsequent use in interconnecting traces formed from first foil 104B to second foil 104A. The thickness of the foil 104B is related to the trace width, the thicker the foil 104A, 104B, the wider the resulting traces will be, and the wider the traces are, the thicker the dry film which is used during a subsequent trace pattern step. In tension with the desire for thin copper foil 104B is the thermal dissipation requirement that bottom copper foil 104B have sufficient thickness to withstand laser drilling step 106. Accordingly, the thickness of first copper surface 104B is governed by the minimum thickness required to withstand the laser drilling of hole 106 without breaking through the lower foil 104B, which also limits how narrow the linewidth and spacing of the resultant trace can be.

The drilling of holes and vias for removal of surface copper and underlying dielectric may be by laser ablation, where the temperature of the catalytic pre-preg is instantly elevated until the catalytic pre-preg is vaporized. It may be preferable to use a laser with a wavelength with a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam diameter and high available power which for forming channels of precise mechanical depth and with well-defined sidewalls.

For a non-catalytic laminate, the drilled vias may receive a catalytic surface treatment known as "desmearing" to enable electroless plating. A typical desmearing process of figure includes a permanganate treatment to remove residues through vigorous oxidation, a neutralizer treatment which neutralizes the permanganate, the application of a surface catalyzer such as palladium for enabling electroless copper plating, after which it is possible to perform an electroless plating step whereby the via and through hole surfaces are coated with copper for connectivity of the top copper foil to bottom copper foil. Alternatively, catalytic particles may be added to the resin of the dielectric to form a catalytic dielectric, for which electroless plating may be performed on drilled holes with only a cleaning operation.

Figure 1C:
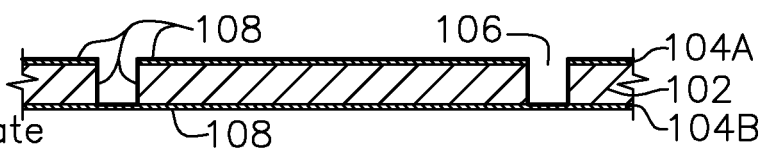

FIG. 1C shows the completion of the subsequent electroless plating step. The electroless plating thickness 108 is the minimum required to uniformly coat drilled via 106 and provide electrical connectivity to foil layers 104A and 104B for a subsequent electroplate operation shown in FIG. 1E.

Figure 1D:
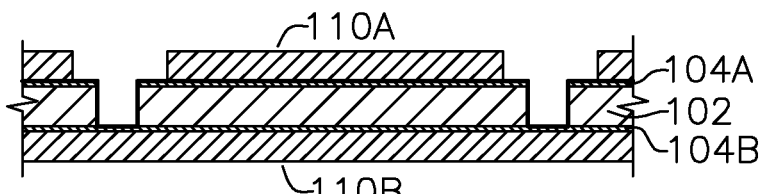
Figure 1E:
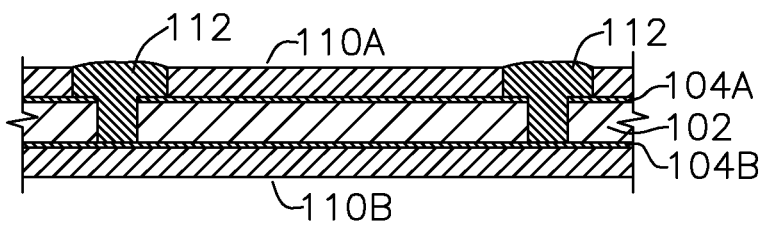

FIG. 1D shows a patterning step, whereby resist 110A is applied on top surface 104A and a blanket resist is applied 110B to bottom surface 104B. Resist (also known as photoresist for patterns formed by exposure to optical energy) or masks (mechanical barriers which forms the desired patterns) 110A and 110B of FIG. 1D or 210A and 210B of FIG. 2F may be liquid photoresist, dry film photoresist, metal masks, or other masking material which has a low etch rate compared to the etch rate of the surrounding exposed copper. The photoresist thickness is typically chosen based on copper/photoresist etch selectivity, such that removal of copper through etching leaves sufficient resist at the end of the etch. Typical dry film thickness is in the range of 0.8-2.5 mil (20-64 u) and the dry film thickness is selected commensurate with the line (trace width)/space (gap between traces) resolution of the finished traces. For example, dry film thickness of 0.8 mil may be used for 1-1.5 mil trace line/space requirements, 1.2 mil dry film may be used for 1.1-2 mil trace line/space, and 1.5 mil dry film may be used for 1.75-2.5 mil line/space requirements. When electroplating occurs as shown in step 1E, only the exposed copper regions receive copper deposition 112, which forms what are known as "dot vias" (where traces are subsequently formed).

Figure 1F:
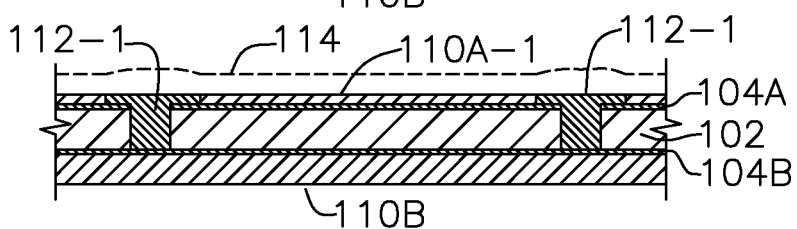

FIG. 1F shows the result of a first smoothing step, whereby a partial removal of excess copper and photoresist from an original layer 114 to a new planar level with dot vias 112-1 reduced in height along with resist 110A-1. Surface smoothing may be accomplished many different ways, for example using a 420 to 1200 grit abrasive applied on a planar surface with mild pressure and linear or rotational agitation between the board and planar surface to provide a grinding operation. Other methods for planarizing the surface may be used, including milling or machining using chemical processes, mechanical processes, or other methods for forming a planar surface. Bottom surface resist 110B is not smoothed, as this process is intended for forming dot vias only.

Figure 1G:
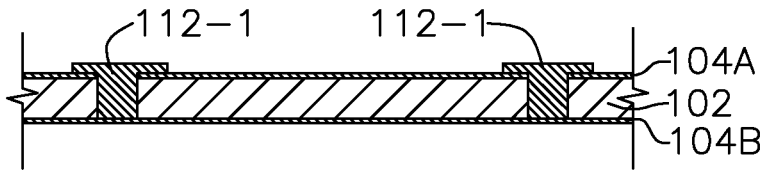

FIG. 1G shows a resist strip step, where resist 110A-1 and 110B of FIG. 1F is removed using a solvent or plasma asking process.

Figure 1H:
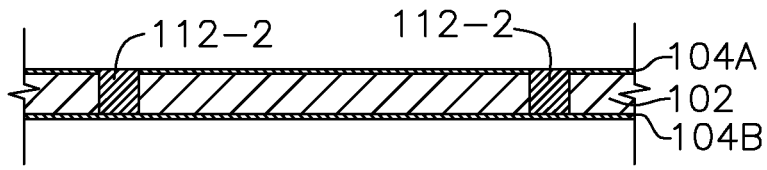

FIG. 1H shows a second smoothing step, whereby the pedestal dot via regions 112-1 of FIG. 1G are planarized down to the foil surface 104A. The reason for performing intermediate planarization of step 1F is to avoid grinding metal and photoresist onto the foil surface 104A. By performing this planarization in a two-step process, the first planarization 1F provides a uniform surface and less material to remove during the final planarization of FIG. 1H.

Figure 1I:
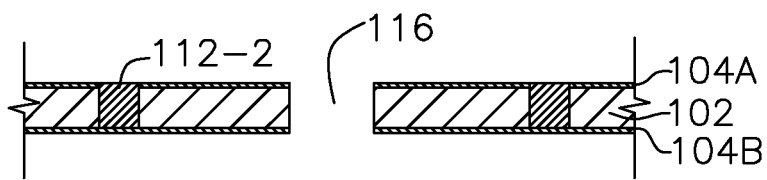
Figure 1J:
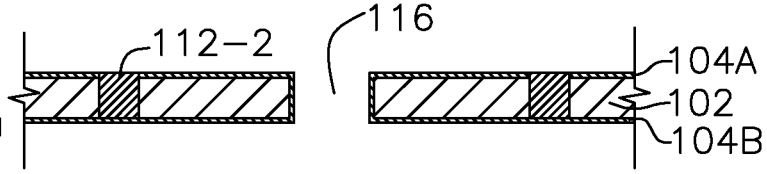
Figure 1K:
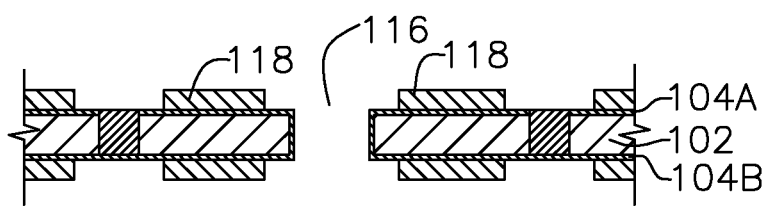
Figure 1L:
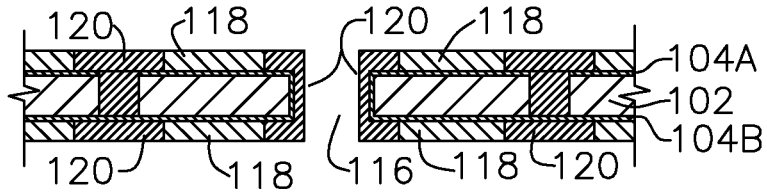

FIG. 1I shows the drilling of through holes 116, which is followed by electroless plating in FIG. 1J which deposits copper on the inner surface of the hole 116, the application of pattern resist 118 to one or both sides in step 1K, and electroplate in step 1L which forms traces on exposed copper surfaces (relying on the top and bottom blanket layer of exposed electroplate copper which provides the single electrode) and inside surfaces of plated through holes 120. The exposed electroplated copper regions subsequently receives a thin layer of tin plate as etch resist over any exposed copper not covered by resist.

Figure 1M:
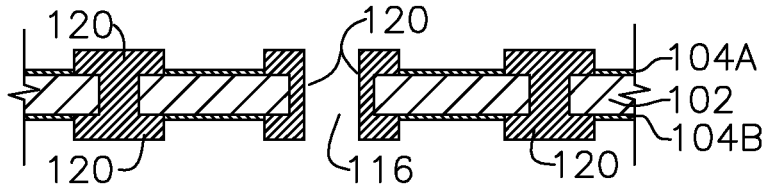

FIG. 1M shows the board after stripping the resist 118 which may also be used to form interconnecting traces (not shown) with the vias 120. At this point, the vias 120 have surface regions which are tin plated (thereby resisting ammonia based copper etchants such as ammonium chloride or ammonium sulfate) and the comparatively thin exposed copper electroless deposition (and underlying foil) on surfaces 104A and 104B, which are etched using a copper etchant such as an ammonia based etchant, producing the result shown in FIG. 1N. The thin deposition of tin is also etched away using an etchant such as nitric acid, leaving copper traces (not shown), though holes, and as vias shown in FIG. 1N.

Figure 1N:
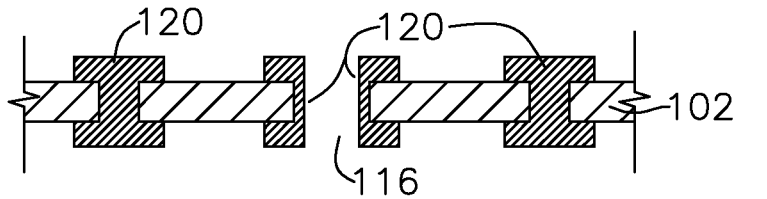
Figure 2A:
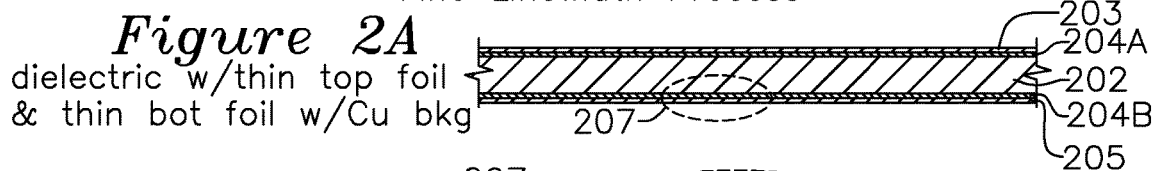
FIGS. 2A, 2B, 2C, 2D, 2E, 2F, 2G, 2H, 2I, and 2J show cross section views of processing steps for forming traces and dot vias for an inner layer of a multi-layer board or a two layer circuit board.
Figure 2B:
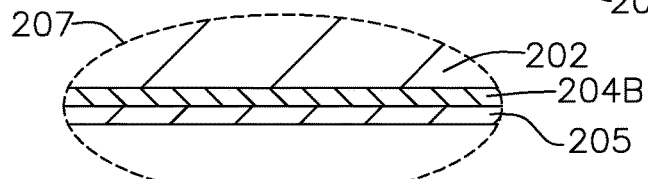

FIGS. 2A through 2J show an alternative process for forming vias on the order of 3.5 mil diameter (optionally in the range of 2-5 mil) and traces on the order of 1 mil width and 1 mil spacing, which are greatly improved over the approximately 3 mil linewidth capability of the steps shown in the series of FIG. 1A through 1N, and with a reduction in the number of required steps. FIG. 2A shows dielectric 202 which is laminated with a top thin foil 204A and a backing foil 203 which protects the thin foil 204A. Similarly, thin bottom foil 204B is laminated onto dielectric 202 along with removable backing foil 205 which is in intimate contact with thin backing foil 204B. The thin top foil 204A and thin bottom foil 204B are approximately 0.12 to 0.15 mil (3 u-4 u) thick and are layered with backing foil 203 and 205, each backing foil having a thickness of approximately 0.75 mil (18 u). Top backing foil 203 may be removed from thin foil 204A at any time prior to electroless plating of step 2E, although bottom backing foil 205 is critical for the laser drilling step of FIG. 2C. FIG. 2B shows a detailed region 207 of FIG. 2A, showing dielectric 202, thin bottom copper foil 204B, and comparatively thick backing foil 205. In one example of the invention, thin bottom foil 204B and backing foil 205 are provided in sheet form, and are laminated under elevated temperature such as 350 to 400° F. and pressure such as 200 to 250 PSI onto catalytic laminate 202 along with top foil 204A to mechanically attach top foil 204A and bottom foil 204B to catalytic dielectric 202. The lamination step for bonding of foils 204A and 204B to the laminate 202 does not alter the ease of removal of backing copper foil 205, which acts as a heat sink for thin foil 204B during the laser drilling operation of FIG. 2C.

Figure 2C:
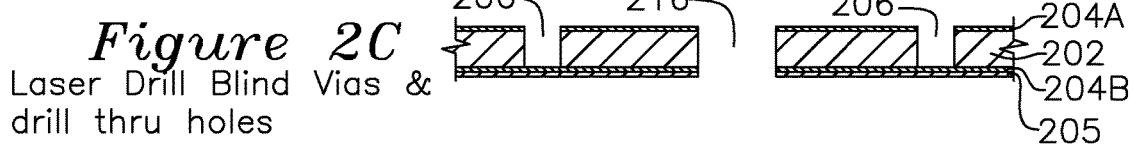
Figure 2D:
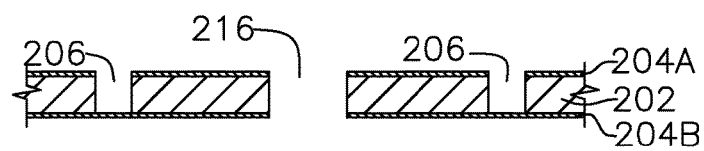

FIG. 2C shows the result of drilling blind via 206 such as by laser ablation, and through holes 216, such as by laser ablation or mechanical. As before, the aspect ratio of blind vias by a laser ablation or drilling operation should be in the approximate range 0.5 to 1. FIG. 2D shows the circuit board layer after removal of the lower backing foil 205 of FIG. 2C, such as by peeling backing foil 205 from bottom thin foil 204B. As in FIG. 1B, the laser ablation or drilling operation may be followed by a "desmearing" operation for non-catalytic laminate, or the laminate itself may be catalytic, as described earlier. Either method ensures that drilling of a blind hole or through hole using a laser, mechanical means, or chemical means results in an aperture with exposed surface catalytic material which provides electroless plating as shown in FIG. 2E.

Figure 2E:
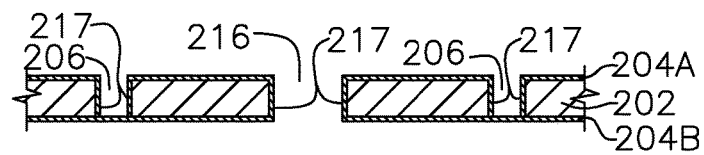

FIG. 2E shows the cross section view after electroless copper deposition, with electroless copper 217 deposited on surfaces of the blind via 206, thru hole 216, and copper foil 204A and 204B.

Figure 2F:
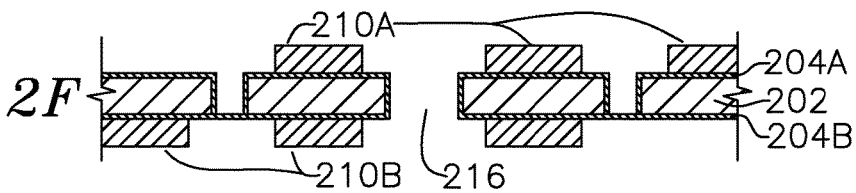

FIG. 2F shows a cross section view after application of patterned photoresist 210A and 210B, where the areas without resist are areas where traces will form.

Figure 2G:
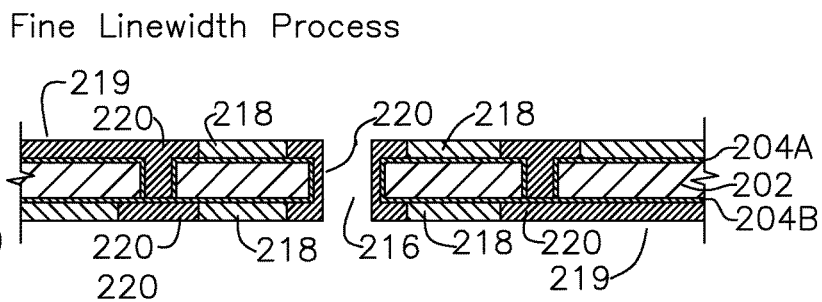

FIG. 2G shows a cross section view after a copper electro-plating step, which deposits copper on all exposed copper areas not concealed by resist, including the via, drill hole walls, and any other copper trace regions not covered by the patterned photoresist.

Figure 2H:
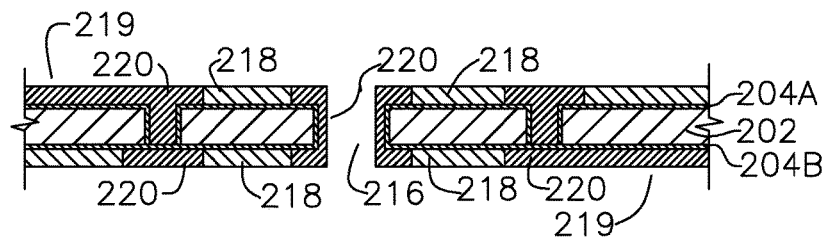

FIG. 2H is a tin plating step, whereby any exposed copper regions receive a thin tin plate which acts as an etch resist during a subsequent copper etching step.

Figure 2I:
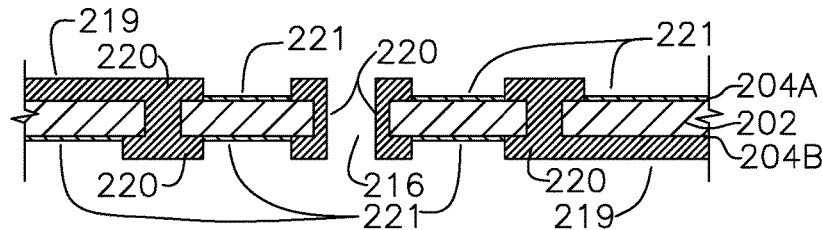
Figure 2J:
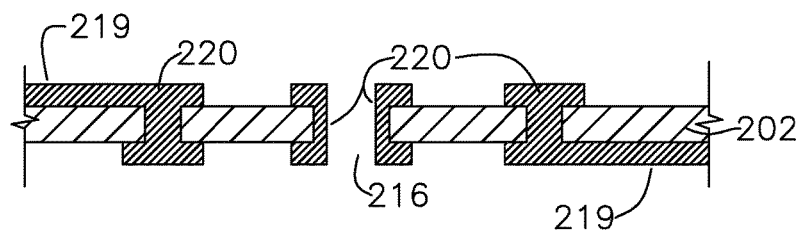

FIG. 2I shows a cross section view after stripping the resist, and FIG. 2J shows the completed circuit board layer after etching the exposed copper (regions not coated with tin in the step of FIG. 2H), and etching the exposed tin, which leaves the dot vias 220, traces, and plated through holes 216.

The process which results in the two layer board of FIG. 2J may be expanded to form multi-layer board, with a structure known as "stacked vias", where the via for a single layer has an aspect ratio of 0.5 to 0.1, while providing connectivity across as many layers as is needed, with the via of each successive layer axially concentric with the via of each preceding layer. FIGS. 3A through 3H describe the additional processing steps for forming multi-layer circuit boards from a central core 304.

FIG. 3A shows a two layer core 304 corresponding to the core of FIG. 2J, with filled vias and traces present. New top layer 302 comprising a dielectric 308 with a top foil 310 and new bottom layer 306 with dielectric 312 and bottom foil 314 are added. These may also include thin foils which have backing foil which has been removed. FIG. 3B shows the new top layer 302 and new bottom layer 306 laser drilled vias 320, 322, 324, 326, and FIG. 3C shows the inner surfaces 328 of the vias have exposed catalytic particles, either by a desmearing operation (which adds catalytic particles to the inside surfaces of the drilled vias) or have catalytic particles in the new top layer 302 dielectric and new bottom layer dielectric 306 which are exposed by the drilling operation of step 3B.

Figure 3F:
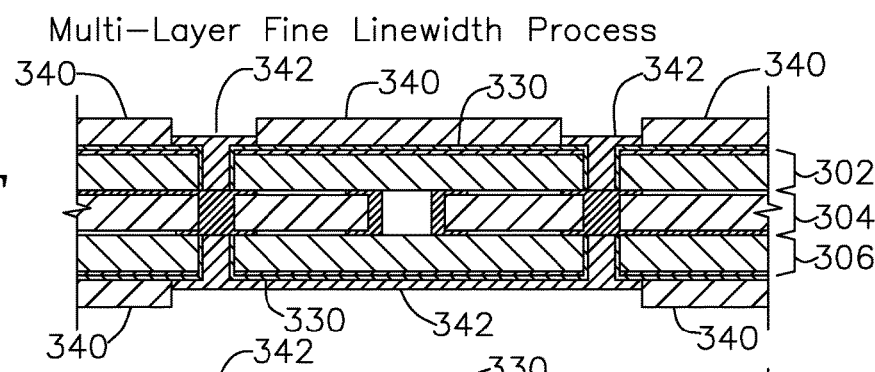
Figure 3G:
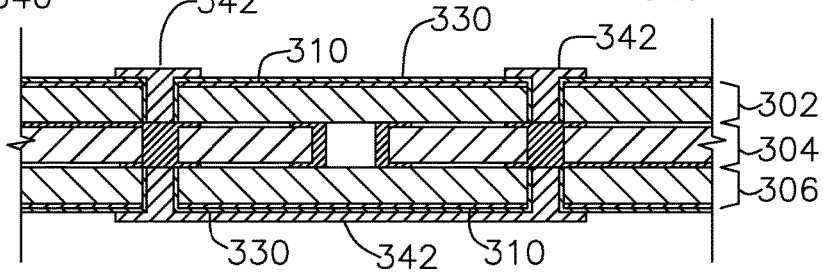
Figure 3H:
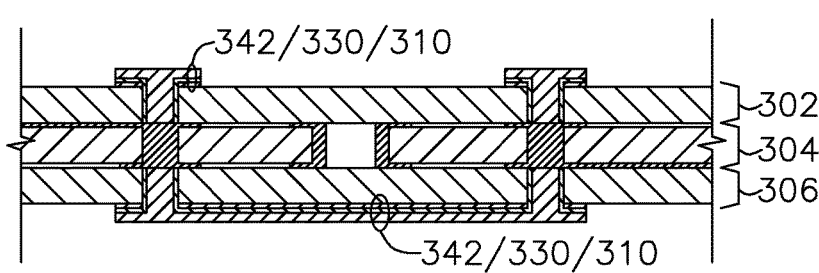

FIG. 3D shows electroless plating deposition 330, and FIG. 3E shows the addition of pattern resist 340 to the new top layer and new bottom layer. FIG. 3F shows the result of electro-plating deposition 342 which forms filled vias and traces, and FIG. 3G shows the resist 340 stripped. FIG. 3H shows the end result 4 layer board, where the stacked vias are interconnected above and below each other, and the vias and traces are formed by layers 342, 330 and 310, which are separately shown in the drawings but act as a single uniform electrical layer. The process steps of FIG. 3A to 3H may be iteratively repeated to add two additional layers on each iteration, with the resulting last step of FIG. 3H treated as the new core for the next iteration of processing starting with FIGS. 3A to 3H. The relative scale of traces to dielectric thickness are exaggerated for clarity in understanding the structures.

Figure 4A:
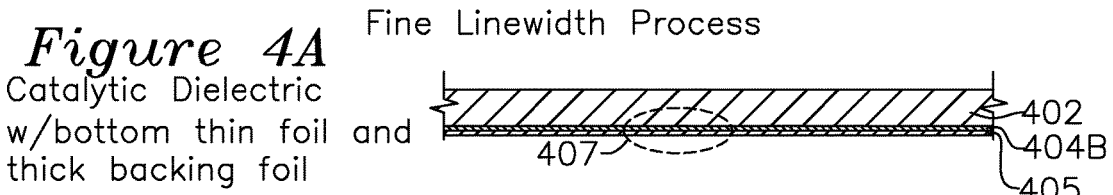
FIGS. 4A, 4B, 4C, 4D, 4E, 4F, 4G, and 4H show cross section views of the processing steps for forming traces and vias on an inner layer of a multi-layer board or a two layer board using a catalytic laminate.
Figure 4B:
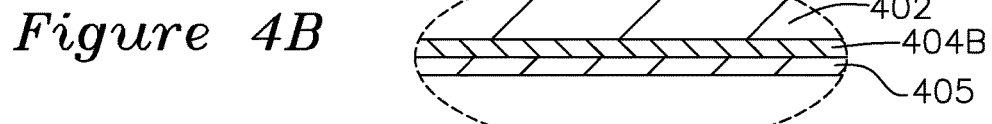
Figure 4C:
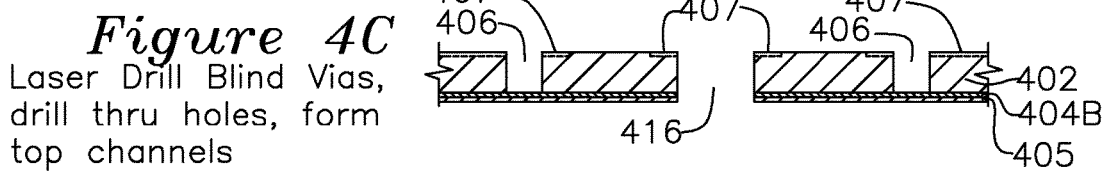
Figure 4D:
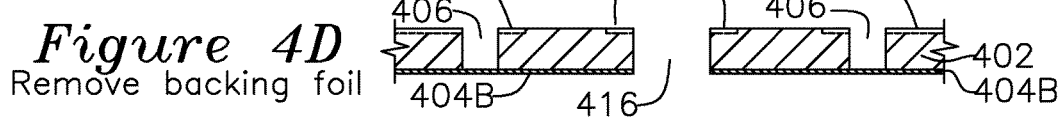

FIGS. 4A through 4J show cross section views of an inner core circuit layer formed using the semi-additive process, where the top layer traces are formed using a catalytic laminate substrate 402 having the characteristic of a resin-rich surface which excludes catalytic particles unless a channel is formed into the surface of the catalytic laminate. The catalytic particles are generally uniformly distributed in the catalytic laminate below an exclusion depth below each surface. In FIG. 4A, the top surface of the catalytic laminate is bare, and the bottom surface of the catalytic laminate has a thin foil 404B and thick backing 405 formed from copper, the thin foil 404B laminated to the catalytic laminate 404B, with the thick backing foil 405 providing heat sinking capability, as previously described for FIG. 2. Detail 407 of FIG. 4B shows the catalytic laminate 402, thin foil 404B, and thick backing foil 405, which have respective dimensions as was previously described for FIG. 2B. Step 4C shows laser drilled holes 406 and through hole 416, where the drilled apertures expose catalytic particles in the catalytic laminate 402, and channels 407 which will later form traces are formed into the top surface, where the channels 407 are sufficiently deep to expose underlying catalytic particles which are not present in the native surface of the catalytic laminate until below the catalytic particle exclusion depth. The via apertures 406 will later be filled with copper using a "fast electroless copper" deposition process, such as commercially available ethylenediaminetetraacetic acid (EDTA) process, or a process which utilizes Copper sulfate, formaldehyde, and sodium hydroxide, rather than the electroplate process described in FIG. 2G. For this reason, the via apertures 406 are smaller, such approximately 2.5-3 mil diameter to permit the via to be filled using the fast electroless copper process. As was described in FIG. 2C, the backing foil 405 acts as a heat sink during the via laser drilling to prevent the penetration of thin bottom foil 404B during laser drilling of vias 406. After the vias 406 are formed, the backing foil 405 is removed, as shown in FIG. 4D.

Figure 4E:
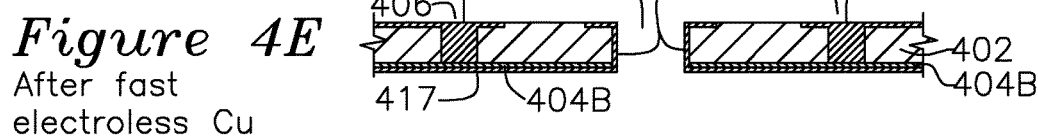

FIG. 4E shows the result of a fast electroless copper bath such as the EDTA process, where the top surface channels 407, through hole 416 inner surfaces and inner volume, and thin copper foil 404B receive copper deposition 417. The via apertures 406 are also filled during this step.

Figure 4F:
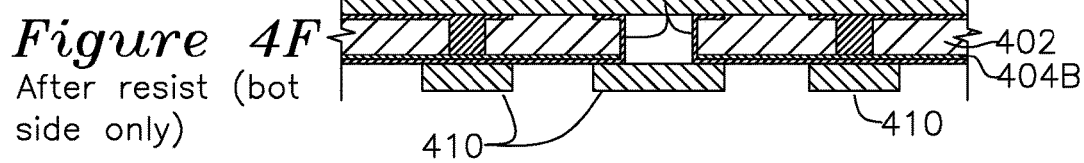
Figure 4G:
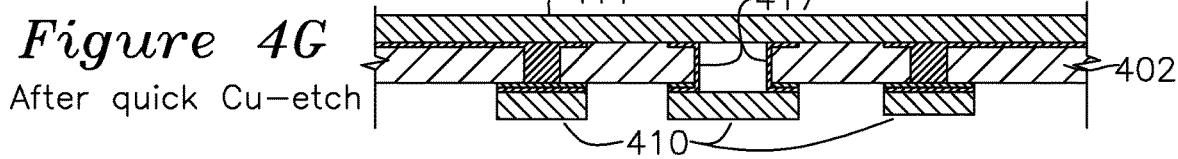
Figure 4H:
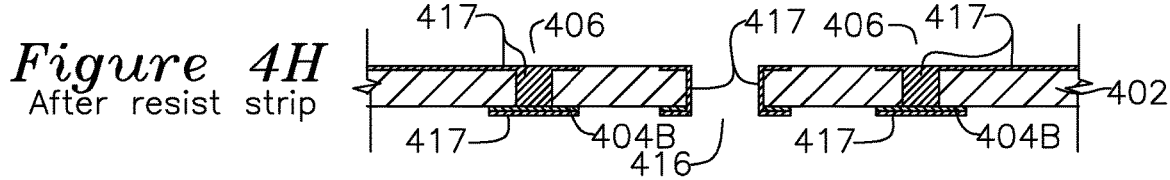

FIG. 4F shows the application of patterned bottom side resist 410 and blanket top side resist 411, which covers the areas where copper traces and vias are desired. The exposed copper surfaces are subsequently etched in FIG. 4G, with the other areas protected by resist such as dry film 410 and 411. After a resist strip in step 4H, the two sided core is complete, with the foil conductors 404B and electroless plated areas 417 and filled via 406 forming homogeneous copper traces and filled vias, thereby forming a finished core which may be further laminated as shown in FIGS. 5A through 5C, or FIGS. 3A to 3H.

Figure 5A:
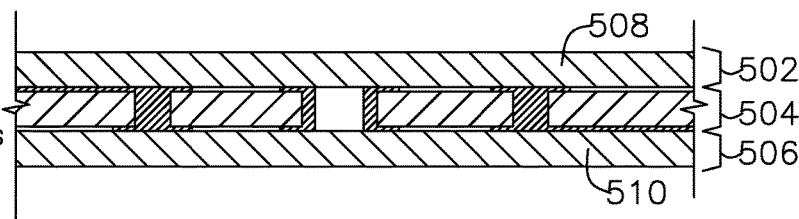
FIGS. 5A, 5B, and 5C show cross section views of the processing steps for a multi-layer board fine linewidth process using a catalytic laminate.
Figure 5B:
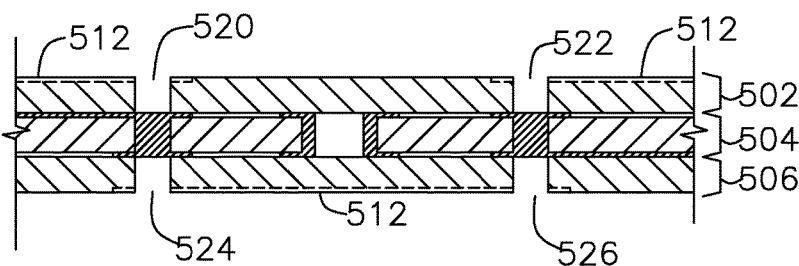
Figure 5C:
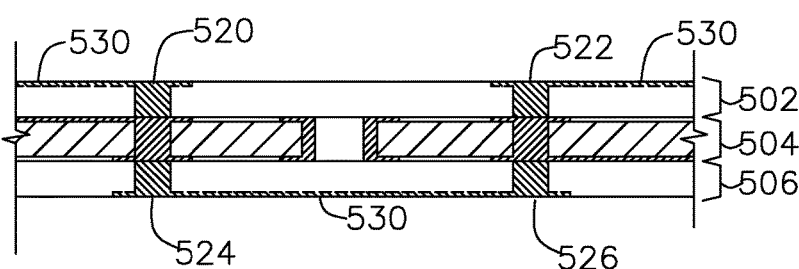

FIG. 5A through 5C shows analogous multi-layer processing steps using catalytic laminate 508 and 510 as outer layers which are laminated to core 504, which core may be formed using the process of FIG. 2A-2J, or 4A-4J.

FIG. 5B shows the laminate of FIG. 5A with channels 512 formed on top and bottom surfaces of the catalytic laminate by removal of the surface layer in a region where a trace is desired. Optionally, an annular ring of material is removed around each via 520, 522, 524, and 526. The removal of surface material may be by laser ablation, where the temperature of the catalytic pre-preg 508 and 510 is instantly elevated until the catalytic pre-preg is vaporized, while leaving the surrounding pre-preg structurally unchanged, but exposing the underlying catalytic particles. It may be preferable to use a laser with a wavelength having a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam extent and high available power which for forming channels of precise mechanical depth and with well-defined sidewalls. An example laser may remove material in a 0.9-1.1 mil (23 u to 28 u) diameter width with a depth governed by laser power and speed of movement across the surface. Another surface removal technique for forming channel 512 and associated annular ring is plasma etching, which may be done locally or by preparing the surface with a patterned mask which excludes the plasma from the surface layers 508 or 510, such as a dry film photoresist or other mask material which has a low etch rate compared to the etch rate of catalytic pre-preg. The photoresist thickness is typically chosen based on epoxy/photoresist etch selectivity (such that plasma etch to the desired depth of removal of the cured epoxy leaves sufficient photoresist at the end of the etch), or in the case of photoresist which is used as an electroplate mask, the thickness is chosen according to desired deposition thickness. Typical dry film thickness is in the range of 0.8-2.5 mil (20-64 u). Plasmas suitable for etching the resin rich surface include mixtures of oxygen (O) and $CF_4$ plasmas, mixed with inert gasses such as nitrogen (N), or argon (Ar) may be added as carrier gasses for the reactive gases. A mask pattern may also be formed with a dry film mask, metal mask, or any other type of mask having apertures. Where a mechanical mask is used, the etch resist may be applied using any of photolithography, screen printing, stenciling, squeegee, or any method of application of etch resist. Another method for removal of the surface layer of pre-preg is mechanical grinding, such as a linear or rotational cutting tool. In this example, the pre-preg may be secured in a vacuum plate chuck, and a rotating cutter (or fixed cutter with movable vacuum plate) may travel a pattern defining the traces such as defined by x,y coordinate pairs of a Gerber format photofile. In another example of removing surface material, a water cutting tool may be used, where a water jet with abrasive particles entrained in the stream may impinge on the surface, thereby removing material below the surface to expose the underlying catalytic particles. Any of these methods may be used separately or in combination to remove surface material and form channel 512 into catalytic dielectric 508 and 510, preferably with the channel extending below the exclusion depth which exposes the catalytic particles below the surface. Accordingly, the minimum channel depth is the depth required to expose the underlying catalytic particles, which is a characteristic of the cured catalytic pre-preg, such as one formed according to U.S. Pat. No. 9,706,650, also by the present inventors. As the catalytic material is dispersed uniformly through the cured pre-preg below the exclusion depth, the maximum channel depth is limited by the depth of the woven fiber (such as fiberglass) fabric of the catalytic laminate 508, 510, which tends to complicate channel cleaning, as the fibers may break off and re-deposit in channels intended for electroless plating, or otherwise interfere with subsequent process steps. Typical channel depths are 1 mil (25 u) to 2 mil (70 u). The final step after removing the surface material to form the channel 510 is to clean away any particles of material which were removed, which may be accomplished using ultrasound cleaning, jets of water mixed with surfactant, or any other cleaning means which does not result in surface material surrounding the channel 512 from being removed.

Vias 520, 522, 524, 526 are next drilled such as by laser drilling, preferably for a small diameter such as 2.5 to 3 mil to allow a fast electroless plating to fill the via apertures in a later step, and channels 512 are formed such as by laser ablation, water cutting, plasma etching, or any other form for removing the surface layer of the catalytic laminate to below the exclusion depth. Electroless plating is performed in step 5C, which deposits copper 530 on areas where surface material has been removed from the catalytic laminate 508, 510, thereby forming conductive traces 530 in the channels 512, inner surfaces of via 520, 522, 524, and 526, filling the via apertures to the outer surface of the added layers 502 and 506. The process steps of FIGS. 5A to 5C may be iteratively repeated to add two additional layers on each iteration, with the resulting last step of FIG. 5C treated as the new core for the next iteration of processing starting with FIGS. 5A to 5C.

The present invention may be practiced several different ways. It is understood that the core (central) circuit layer 304 of FIGS. 3A-3H or 504 of FIGS. 5A-5C may result from either the catalytic or non-catalytic laminate 202 of FIG. 2J or the catalytic laminate of FIG. 4J. Starting with either core circuit layer of FIG. 2J or 4J, outer layers may be interchangeably added using the electroless and electro-plating method of FIGS. 3A to 3H, or the electroless plating method of FIGS. 5A to 5C.

In the present specification, "mil" is understood to be 0.001 inch, "approximately" is understood to mean less than a factor of 4 greater or smaller, "substantially" is understood to mean less than a factor of 2 greater or smaller. "Order of magnitude" of a value includes the range from 0.1 time the values to 10 times the value. A "mil" is understood to be 0.001 inch.

Certain post-processing operations are not shown which are generic to printed circuit board manufacturing, and may be performed using prior art methods on boards produced according to the novel process. Such operations include tin plating for improved solder flow, gold flash for improved conductivity and reduced corrosion, soldermask operations, silkscreening information on the board (part number, reference designators, etc.), scoring the finished board or providing breakaway tabs, etc.

We claim:

1. A process for forming vias and traces on a circuit board comprising:
   providing the circuit board having a catalytic laminate having a top surface and a bottom surface, the bottom surface having a bottom thin foil bonded to the bottom surface of the catalytic laminate, and a comparatively thicker removable backing foil applied to the bottom thin foil, the catalytic laminate having particles of catalyst below a resin rich surface which enables electroless plating only on surfaces which have been drilled or where the resin rich surface has been removed;
   laser drilling blind vias through the catalytic laminate top surface to the bottom thin foil without penetrating the bottom thin foil, drilling at least one through hole penetrating the laminate, the bottom thin foil, and the bottom backing foil;
   removing the bottom backing foil;

electroless plating the bottom thin foil, via surfaces, and through hole surfaces to form an electrically continuous conductive layer;

applying patterned resist to the top surface and bottom surface;

electro-plating the circuit board by depositing copper until copper is deposited on exposed copper areas to a level below the patterned resist;

tin plating the exposed copper areas of the circuit board;

stripping the patterned resist;

etching the exposed copper areas until the electroplated copper and underlying thin foil is removed;

etching the tin plating;

laminating additional dielectric layers and foil layers to the top or bottom surface of the circuit board.

2. The process of claim 1 where said bottom thin foil is approximately 0.12 to 0.15 mil thick.

3. The process of claim 1 where said laser drilled vias and said at least one through hole exposes catalytic particles of the catalytic laminate.

4. The process of claim 1 where said catalytic particles include at least one of: Palladium (Pd), platinum (Pt), rhodium (Rh), iridium (Ir), nickel (Ni), gold (Au), silver (Ag), cobalt (Co), copper (Cu), iron (Fe), manganese (Mn), chromium (Cr), molybdenum (Mo), tungsten (W), titanium (Ti), or tin (Sn).

5. The process of claim 1 where said resist is a dry film which is optically exposed to form said patterned resist.

6. The process of claim 1 where etching the exposed copper areas further comprises etching the tin plating.

7. The process of claim 1 where the catalytic laminate top surface further comprises a top thin foil.

8. The process of claim 7 where the top thin foil or bottom thin foil comprises copper foil approximately 0.12 mil to 0.15 mil in thickness.

9. A process for forming vias and traces on a circuit board comprising:

providing the circuit board comprises a catalytic laminate having a bottom thin foil bonded to the catalytic laminate, a comparatively thicker backing foil adjacent to the bottom thin foil, and a top thin foil;

laser drilling blind vias through the catalytic laminate top surface to the bottom thin foil, drilling at least one through hole penetrating through the catalytic laminate, bottom thin foil, and backing foil, the catalytic laminate having catalytic particles below the surface and which are exposed by drilling;

removing the backing foil;

electroless plating the top thin foil surface, the bottom foil surface, the inner surfaces of the vias, and the inner surfaces of the at least one drilled through hole catalytic particles exposed by the laser drilling;

applying patterned resist over the top and bottom surface of the catalytic laminate;

electro-plating the circuit board by depositing copper until copper is deposited to a level below the patterned resist;

tin plating electro-plated copper regions of the circuit board where the patterned resist is not present;

stripping the patterned resist, thereby exposing copper regions previously covered by the patterned resist;

quick etching the exposed copper regions to the underlying catalytic laminate.

10. The process of claim 9 where the top surface comprises a top thin foil comprising copper foil approximately 0.12 mil to 0.15 mil in thickness.

11. The process of claim 9 where said laser drilled vias are less than 5 mils in diameter.

12. The process of claim 9 where said electroless plating and said electroplating deposits copper.

13. The process of claim 9 where said catalyst comprises at least one of: Palladium (Pd), platinum (Pt), rhodium (Rh), iridium (Ir), nickel (Ni), gold (Au), silver (Ag), cobalt (Co), copper (Cu), iron (Fe), manganese (Mn), chromium (Cr), molybdenum (Mo), tungsten (W), titanium (Ti), or tin (Sn).

14. The process of claim 9 where said electroless plating step deposits approximately 0.06 mil to 0.12 mil thickness of copper over said bottom thin foil.

15. The process of claim 9 where said patterned resist is optically exposed dry film.

16. The process of claim 9 where said quick etching further comprises an ammonium based etchant comprising at least one of ammonium chloride or ammonium sulfate.

* * * * *